(12) United States Patent
Patel et al.

(10) Patent No.: US 6,816,374 B2
(45) Date of Patent: Nov. 9, 2004

(54) HIGH EFFICIENCY HEAT SINK/AIR COOLER SYSTEM FOR HEAT-GENERATING COMPONENTS

(75) Inventors: Janak G. Patel, South Burlington, VT (US); Jerzy M. Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/397,028

(22) Filed: Mar. 25, 2003

(65) Prior Publication Data

US 2004/0190248 A1 Sep. 30, 2004

(51) Int. Cl.[7] ................................................. H05K 7/20
(52) U.S. Cl. ...................... 361/697; 165/80.3; 165/121; 165/185; 257/722; 361/703; 361/704
(58) Field of Search .............................. 165/80.2, 80.3, 165/121–122, 185; 174/16.3; 257/706–707, 712–713, 722; 361/687–721

(56) References Cited

U.S. PATENT DOCUMENTS

| | | | |
|---|---|---|---|
| 4,920,574 A | * | 4/1990 | Yamamoto et al. .......... 361/703 |
| 5,597,034 A | | 1/1997 | Barker, III et al. |
| 5,615,998 A | | 4/1997 | Kodama et al. |
| 5,782,292 A | | 7/1998 | Ogawara et al. |
| 5,787,976 A | * | 8/1998 | Hamburgen et al. ........ 165/185 |
| 5,794,685 A | | 8/1998 | Dean |
| 5,828,551 A | | 10/1998 | Hoshino et al. |
| 5,940,268 A | | 8/1999 | Miyahara et al. |
| 5,943,209 A | | 8/1999 | Liu |
| 6,009,938 A | * | 1/2000 | Smith et al. ................. 165/185 |
| 6,109,341 A | | 8/2000 | Kodaira et al. |
| 6,176,299 B1 | | 1/2001 | Hanzlik et al. |
| 6,179,046 B1 | | 1/2001 | Hwang et al. |
| 6,196,300 B1 | | 3/2001 | Checchetti |
| 6,336,499 B1 | * | 1/2002 | Liu ............................ 165/80.3 |
| 6,698,499 B1 | * | 3/2004 | Wagner et al. ............. 165/80.3 |
| 6,702,002 B2 | * | 3/2004 | Wang ......................... 165/80.3 |

* cited by examiner

Primary Examiner—Gregory D. Thompson
(74) Attorney, Agent, or Firm—Scully, Scott, Murphy & Presser; William H. Steinberg

(57) ABSTRACT

A high efficiency two-part heat sink and air cooler apparatus or system for heat generating components, such as CPUs (central processing units) or the like electronic components. Moreover, there is also provided to a method of providing a high-efficiency heat sink and air cooling for the cooling of electronic components such as CPU units for processors, computers and diverse heat-generating devices.

20 Claims, 3 Drawing Sheets

HIGH EFFICIENCY HEAT SINK/AIR COOLER SYSTEM FOR HEAT-GENERATING COMPONENTS

BACKGROUND OF THE INVENTION

1. Field of the Invention

The present invention relates to a high efficiency heat sink and air cooler apparatus or system for heat generating components, such as CPUs (central processing units) or the like electronic components. Moreover, the invention is directed to a method of providing a high-efficiency heat sink and air cooler apparatus for the cooling of electronic components such as CPU units for processors, computers and diverse heat-generating devices.

During the operation of electronic components, such as CPUs which are employed in diverse electronic devices; for example, such as processors, computers and the like, intense amounts of heat are generated by the electronic components, whereby in order to avoid damaging the electronic components and adversely affecting the efficient operation thereof require that generated heat be withdrawn from the electronic components and thereafter dissipated preferably to the surroundings.

In order to achieve the desired heat removal and dissipation effect, the processors or CPUs are normally equipped with heat sink and/or heat removal or air cooling devices which are adapted to dissipate or withdraw any heat generated by the electronic components and to transfer or convey the heat to a location at which it may be dissipated, such as the surroundings.

In various instances of utilization, such heat sink devices may simply consist of heat pipes for conducting the generated heat away from the electronic components; in other cases, such devices may be constituted of structures possessing heat-conductive properties, possibly incorporating finned surfaces which will assist in heat dissipation, and which optionally may also be equipped with fans for the circulation of air so as to either remove heated air from the electronic components, or alternatively to convey flows of cooling air towards the electronic components.

2. Discussion of the Prior Art

Basically, a considerable diversity of structures and methods have been developed in the technology which is concerned with the removal of heat generated by the operation of electronic components for example, such as the CPUs, of processor or computers through the intermediary of either heat sink components which are constituted of thermally-conductive materials, and which may also be assisted in the removal of heat by means of auxiliary fan structures adapted to produce a flow of the heated air directed away from the electronic components.

Checchetti U.S. Pat. No. 6,196,300 B1 describes a heat sink which is constituted of a single body of a rectangularly-shaped structure including a plurality of circumferentially-spaced fins projecting upwardly from a planar base surface and directed radially outwardly. A conical heat dissipating element comprises a transformer which is positioned between a microchip and a heat sink surface.

Hwang et al., U.S. Pat. No. 6,179,046 B1 disclose a unitary body of rectangular configuration forming a heat sink with a number of upwardly protruding fins extending radially from the center of a flat base surface. The fins are directed radially outwardly such that a flow of air is directed, by means of a cover portions superimposed thereon in two specific directions away from a heat-producing source, such as a CPU.

Hanzlik et al. U.S. Pat. No. 6,617,299 B1 discloses a cooling apparatus for electronic devices including a number of fins encompassing a fan structure so as to enable air to be circulated radailly outwardly past the cooling fin arrangement.

Kodaira et al., U.S. Pat. No. 6,109,341 describe a cooling apparatus for electronic components, including an elongated heat sink in which a single body of rectangular configuration includes upwardly protruding fins which are directed radially outwardly. A cover portion causes air to he directed in two separate orientations so as to cause a flow of air to direct heat away from operating electronic components.

Miyahara et al., U.S. Pat. No. 5,940,268 disclose a single body forming a heat sink for an electronic device comprising fan-motor employed for the circulation of either heat-withdrawing or cooling air for the electronic device. A plurality of upstanding structural components direct the airflow in various operative cooling directions so as to constitute a heat sink.

Liu U.S. Pat. No. 5,943,209 discloses a base member mounting a plurality of radially outwardly extending fin members which support a fan. structure above electronic components. The fan structure is intended to draw heated air through the fins away from the heat-generating electronic components in order to cool the latter, and with the fins dissipating the heated air radially outwardly into the surroundings.

Hoshino et al. U.S. Pat. No. 5,828,551 disclose a rectangular heat sink structure constituted of a single body with a flat base and a plurality of upwardly and radially outwardly directed fins with sloping base surfaces. An impeller blade structure is located in the center of the cavity in order to circulate air relative to an electronic component for cooling the latter.

Dean U.S. Pat. No. 5,794,685 discloses a heat sink structure having radially directed heat and air flow paths provided for by a number of radially extending fins. The air is circulated so as to be diverted along the heat dissipating fin structure of the heat sink in directions leading away from a heat-generating electronic component, such as an integrated circuit Ogawara et al. U.S. Pat. No. 5,782,292 disclose a heat sink for an electronic component cooling apparatus, wherein a plurality of radially extending, circumferentially distributed fins, which are mounted on a base plate are able to absorb heat generated by the electronic component for the dissipation of heat generated by the electronic component.

Kodama et al. U.S. Pat. No. 5,615,998 disclose a cooling apparatus for electronic components, including a plurality of fins adapted to form constituents of a heat sink by absorbing and dispersing heat which is generated from the operation of the electronic components.

Finally, Barker III, et al. U.S. Pat. No. 5,597,034 disclose a heat sink for electronic components wherein a plurality of radially extending fins have a circulating fan structure superimposed thereon for creating a flow path of electronic component-generated heated air directing the generated heat away from the electronic components to as to cool the latter in a rapid manner.

Although the foregoing patent publications each describe individual types of heat sinks for electronic components which may comprise thermally-conductive fin structures of heat-absorbent materials and which may be employed in conjunction with an air circulating fan adapted to enhance the heat withdrawal and dissipating functions for the cooling of heat-producing electronic components, these are still subject to limitations in the capabilities of being able to remove heat in a rapid and efficient manner so as to in a highly efficiently provide a heat sink and air cooling structure for electronic components, such as CPUs, interpreted circuits, among other such applications.

SUMMARY OF THE INVENTION

Accordingly, pursuant to the invention, in order to enhance the degree of efficiency in the cooling of heat-generating electronic components, such as CPUs or the like, the invention provides for a heat sink apparatus which is essentially constituted of two basic components of metallic extrusions which are press-fitted to each other, with one of the extrusions forming a central shaft member having radially outwardly extending fins arranged distributed about the shaft circumference, which is axially pressed into an outer ring-shaped member having a plurality of circumferentially distributed radially inwardly projecting fins, such that the fins of the inner and outer members are in a radially interspersed spaced relationship with each other.

The mutually inserted components comprising the two part extruded metallic heat sink member portions may be fixedly interconnected by the interposition an adhesive possessed of a high thermal conductivity, which is employed as a lubricant during the pressing together of the two inner and outer heat sink components.

These joined components, which form the basic structure for a high-efficiency thermal conductivity heat sink in the unique two-part arrangement, are adapted to be mounted on a substrate, such as a CPU (central processing unit) or any other heat-generating electronic components, for example, such as a processor, computer, integrated circuit or the like, by means of preferably a heat sink latch member mounting the interengaged heat sink finned components. Thus, the external wall of the heat sink structure which is comprised by the outer cylindrical member with the radially inwardly directed fins, forms a tubular air channel for a so called fin exchanger, and provides an concentric and equally distributed heat exchange surface for the entire CPU die surface. The central post or shaft of the heat sink apparatus, which is constituted from the internal member having the center shaft with the radially outwardly extending fins is employed for the rapid heat transfer out of the CPU, as well as constituting a support for a turbine, a fan or air-moving device mounted thereon, which turbine or device includes first and second turbine or air-moving blades which may be selectively rotated in either the same or counter-rotating directions. The turbine or air-moving device allows for an increased air compression above the heat sink entry, thus facilitating for an increased air speed in the flow through the heat exchanging fins to provide for either a cooling action by the heat sink through a flow of incoming cool air, or conversely by a flow of air removing heat from the electronic component; in effect, the CPU.

As the interleaved fins of the heat sink members have the air flow passing through therebetween, the rotation of the two turbine or fan blades in selectively the same or in counter-rotating direction, which are superimposed on each other will enhance the withdrawal of heat from the CPU, or electronic component, for effectuating the high-efficiency cooling thereof.

It is also within the scope of the invention that the foregoing heat sink structure is connected to an external wall outlet through the intermediary of a flanged opening, in that a bellows connects the end of the tubular outer finned section above the turbine blade or air-moving arrangement with the wall outlet, thereby facilitating the rapid flow of cooling air therethrough.

Accordingly, it is an object of the present invention to provide a high efficiency heat sink/air cooler arrangement for a heat-generating electronic component.

Another object of the invention resides in providing a novel heat sink arrangement comprising at least two heat sink members having interleaved thermally-conductive fins for the withdrawal of heat from an electronic component, such as a CPU.

Yet another object of the invention is to provide a turbine blade, fan or air-moving structure which is operatively connected to the inventive heat sink arrangement for enhancing a flow of cooling air towards the electronic component or alternatively for drawing heat away from the electronic component.

Still another object of the invention resides in the provision of a method for cooling an electronic component, such as CPU, in a highly efficient and rapid manner employing the heat sink arrangement pursuant to the invention.

BRIEF DESCRIPTION OF THE ACCOMPANYING DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1:
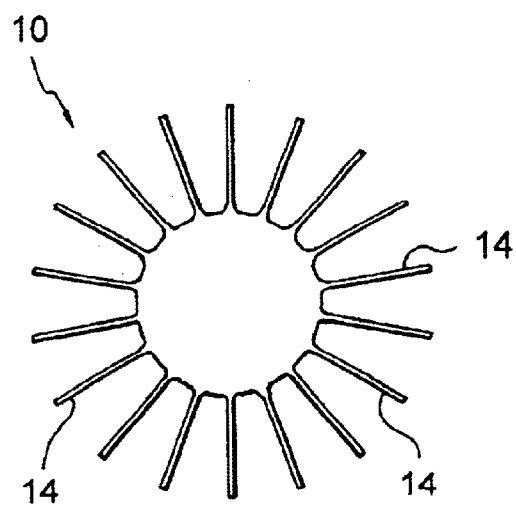
FIG. 1 illustrates an end view of an internal member of a two-part heat sink structure.

Referring specifically to FIG. 1, illustrated is a plan view of a first heat sink portion 10 comprised of a central shaft member 12 having a plurality of circumferentially spaced radially extending fins. The shaft member 10 and fins 14 are integral or of unitary construction, and may be an extruded element. The construction thereof is preferably of a highly thermally-conductive metallic material, such as aluminum, copper or the like. The length of the fins 14 is designed to impart a specified diameter to the portion 10.

Figure 2:
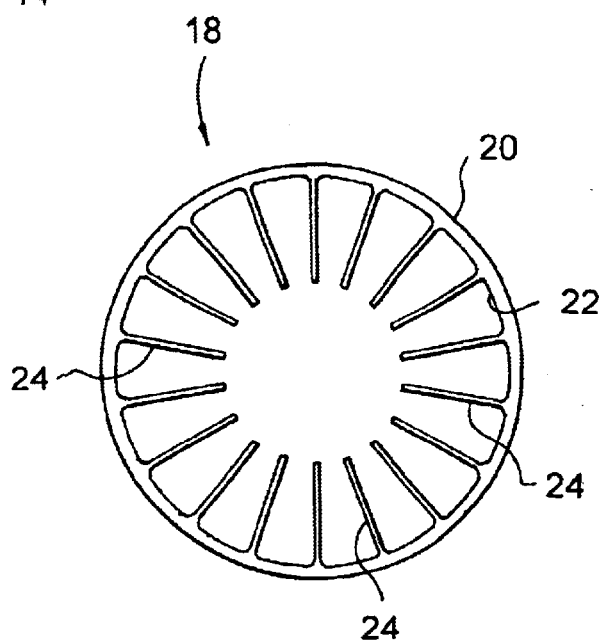
FIG. 2 illustrates an end view of an external member of the two-part heat sink structure.
Figure 3:
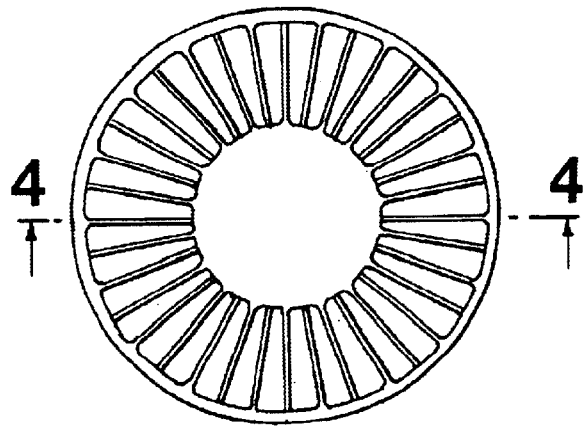
FIG. 3 illustrates an end view of the internal and external heat sink members in a mutually inserted assembled condition forming the two-part heat sink structure.
Figure 4:
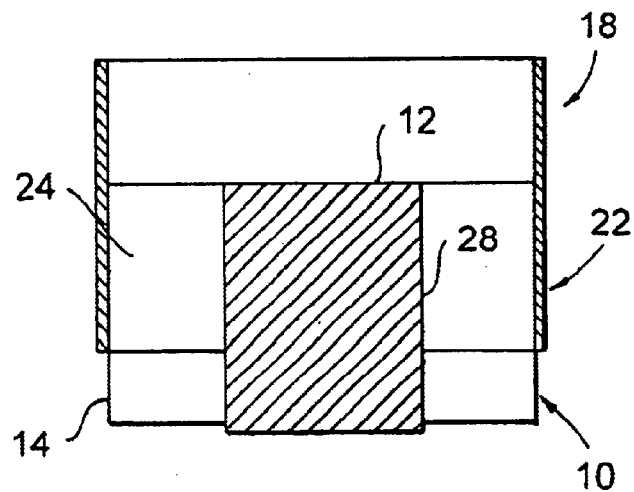
FIG. 4 illustrates a longitudinal sectional view, taken along line 4—4 in FIG. 3.

A second heat sink portion 18 comprises a cylindrical member 20 having the internal wall surface 22 thereof equipped over a section of the height thereof with a plurality radially inwardly extending fins 24, circumferentially spaced as shown in FIG. 2 of the drawings. The number of fins 14 preferably conforms to the number of fins 24, with the fins 14 each being of a length so as to contact internal wall surface 22 when the heat sink portion 10 is inserted into heat sink portion 18, as shown in FIGS. 3 and 4. Similarly, the radially inward extending fins 24 are each of a length so as to contact the circumferential surface of shaft member 12. As is heat-sink portion 10, this particular component 18 is also constituted of a highly thermally-conductive metallic extrusion, such as aluminum, and whereby the two heat-sink portions 10, 18 which are respectively constituted of the inner and outer elements may be press-fitted into each other, as shown in FIGS. 3 and 4 of the drawings, whereby the inner portion 10 over the greater extent of its axial length is pressed into the outer cylindrical portion 18, such that the fins 14 of the inner portion are in a circumferentially interleaved or interspersed relationship with the radially inwardly directed fins 24 of the outer portion 18, as shown.

Figure 5:
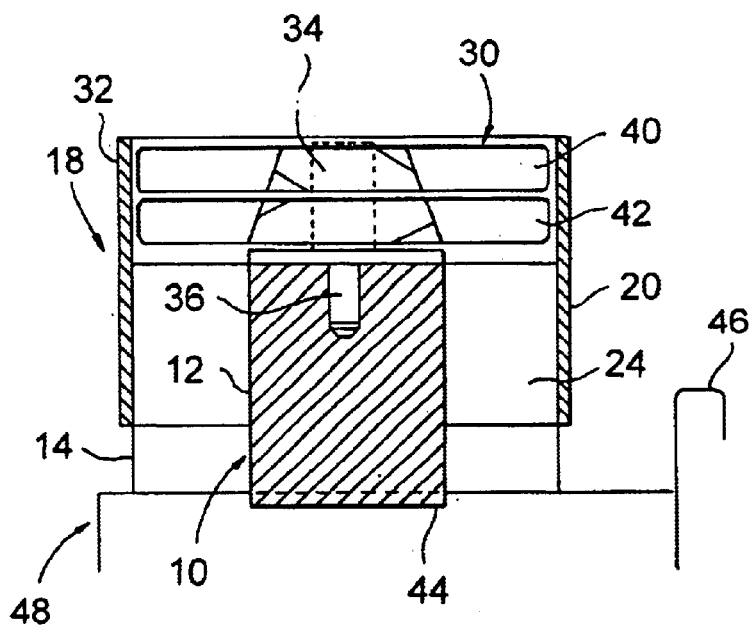
FIG. 5 illustrates a sectional view, similar to that in FIG. 4, showing a two-blade turbine, fan or air-moving device mounted on the two-part heat sink structure.

During pressing-in assembly of heat sink portions 10 and 18, a high thermal-conductivity adhesive 28 is provided, as shown in FIG. 4, to the members 12, 24 and 14, 22, applied to the ends of the fins of the first and second heat sink members as a lubricant. The central shaft member 12 of the inner heat sink portion 10 is used for fast transfer of heat out of an electronic component such as a CPU, as well as providing a support for a bladed turbine, fan or air-moving device 30 which is inserted into a protruding part 32 of the outer cylindrical member 20, the blades of which may be selectively rotated in either the same or counter-rotting directions, and which may have a turbine or fan shaft 34 suitably fastened or screwed at 36 into the central shaft member 12 of the inner sink portion 10, as shown in FIG. 5 of the drawings.

Connected by means of the turbine or air-moving device shaft 34 which extends from the central shaft member 12 of the heat-sink inner portion 10, are first and second tandem arranged or superimposed fan blades 40,42 which may be rotatable in either the same or counter-rotated directions in order to provide for a rapid air flow, as described hereinbelow.

The opposite end 44 of the high thermal conductivity adhesive-covered shaft member 12 may be connected by means of a suitable heat sink latch 46 to a substrate, comprising a heat-generating electronic component, such as a CPU 48 or the like.

Figure 6:
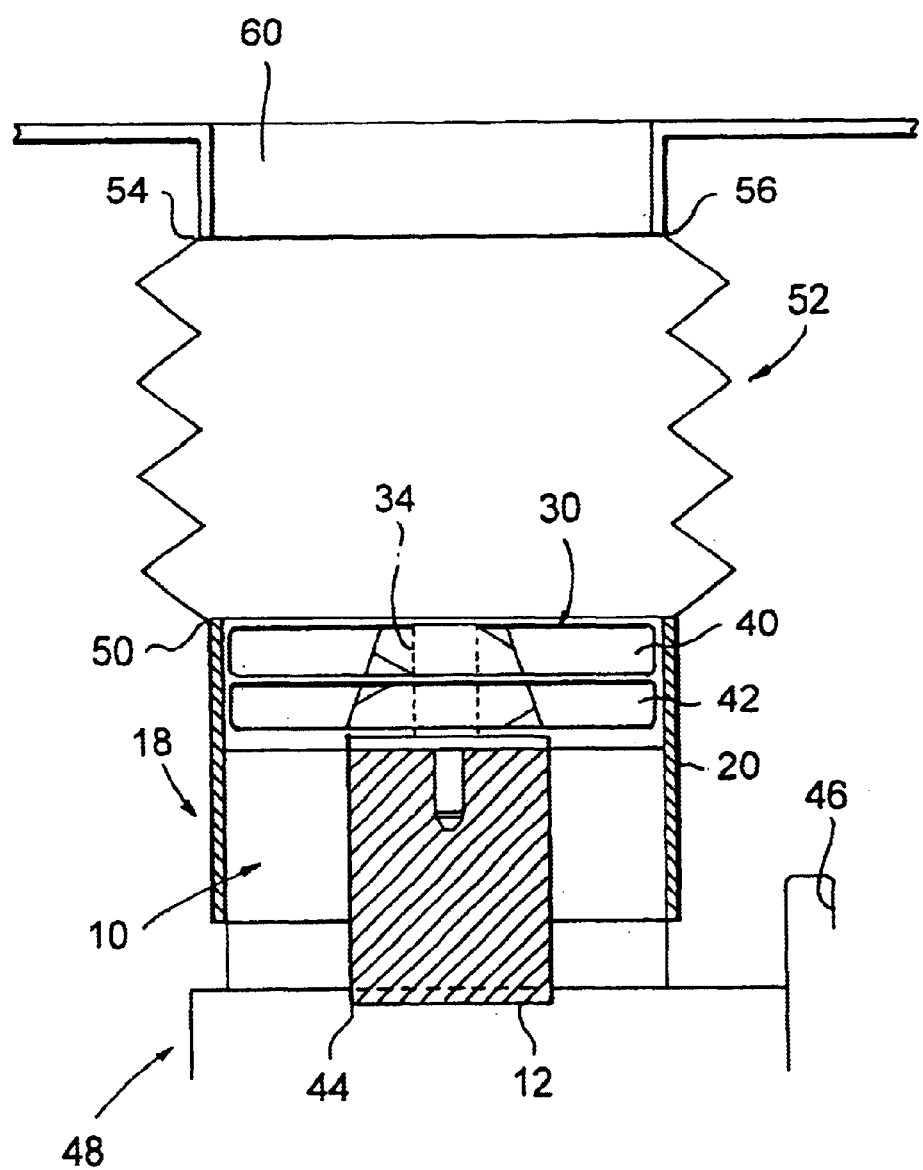
FIG. 6 illustrates a sectional view, similar to that in FIG. 5, showing the connection of the structure to an external wall.

As illustrated in the drawing FIG. 6, the end 50 of cylindrical wall 20 of the outer heat sink structure 18 may be connected to an outer wall output or outlet 60 in order to facilitate the egress of heated air out of the heat sink system. This is accomplished by a bellows 52 which is attached to the one end 50 of the cylindrical member 20 opposite that facing towards the electronic component, with the opposite end 54 of the bellows, in turn, being connected to an outlet flange 56 at the outer wall outlet 60 of the structure. This enables the entire heat-sink arrangement to provide a highly efficient thermal conduction system not at all encountered in the prior art, particularly inasmuch as the present concept utilizes two cooperative heat sink components constituted of an external heat conductive tubing or cylindrical extrusion 18 with radially inwardly directed fins 24, which is pressed into an internal shaft member 12 having radially outwardly directed fins 14 which are in alternate overlapping circumferentially spaced relationship with the radially inwardly extending fins.

As previously indicated, the cooling fan blades 40,42 of the turbine or air-moving device 30 pursuant to the invention as encompassed by the external cylindrical surface form a "chimney-like" air duct constituted of a section of the outer cylindrical heat sink portion 18, and whereby at least two or possibly more fan blades may form the turbine or air-moving device. During operation, heated air may be drawn outwardly away from the electronic component through the bellows, or the fan blades may facilitate the inlet of cooling air towards the electronic component depending upon the direction of rotation of each of the turbine blades relative to each other.

From the foregoing it becomes readily apparent that the invention is directed to a novel and highly efficient heat sink arrangement for electronic components, such as CPU's, integrated circuits and the like, which provides vastly enhanced cooling capabilities and efficiency in comparisons with the current state-of-the technology. The cylindrical construction of heat sink member 18 forms a tubular air channel, and facilitates a concentric and uniform heat exchange for the entire CPU surface. Furthermore, the central shaft 12 is adapted for a rapid heat transfer out of the CPU, as well as providing a support for the turbine or air-moving device 30. The employment of the turbine or air-moving device concept allows for an increased air compression above the heat sink, resulting in a higher airspeed through the heat fins 14,24.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A high-efficiency heat sink and air cooler system for the cooling of heat-generating components, said system comprising:

a first heat sink member comprising a center shaft having a plurality of radially outwardly extending fins spaced about the circumference of said shaft, said shaft having one end thereof adapted to be positioned on a heat-generating component; and a second heat sink member comprising a cylindrical portion having a plurality of radially inwardly extending fins spaced about the inner circumference of said cylindrical portion, said second heat sink member being mounted in axially overlapping relationship on said first heat sink member whereby said radially outwardly extending fins and radially inwardly extending fins are in an interleaved position relative to each other.

2. A heat sink and air cooler system as claimed in claim 1, wherein said first heat sink member is press-fitted into said second heat sink member such that the radially outer ends of said fins of said first heat sink member contact the inner surface of the cylindrical portion of said second heat sink member, and the radially inner ends of said fins of said second heat sink member contact the circumference of said shaft of said first heat sink member.

3. A heat sink and air cooler system as claimed in claim 1, wherein said first and second heat sink member are each extruded from a thermally-conductive metallic material.

4. A heat sink and air cooler system as claimed in claim 3, wherein said metallic material comprises aluminum or copper.

5. A heat sink and air cooler system as claimed in claim 2, wherein a high-thermally conductive adhesive is applied to the ends of the radial fins of said first and second heat sink members as a lubricant during said press-fitted assembly between said heat sink member.

6. A heat sink and air cooler system as claimed in claim 1, wherein an axial length of the cylindrical portion of said second heat sink member projects beyond said first heat sink member; a turbine or air-moving device comprising fan blades which are selectively rotatable in the same or counter-rotating directions being mounted on said shaft of said first heat-sink member within the confines of the axial length of said cylindrical portion so as to facilitate an enhanced air compression above said heat sink system and increasing cooling air flow through the spaces between said interleaved fins.

7. A heat-sink and air cooler system as claimed in claim 6, wherein said turbine or air-moving device comprises at least said two fan blades in superimposed tandem arrangement, said fan blades being directionally selectively rotatable for drawing heated air away from said heat-generating components or directing a flow of cool air towards said heat-generating component.

8. A heat sink and air cooler system as claimed in claim 1, wherein a first end of a bellows connects said heat sink system to an outlet in a wall connected to a second end of said bellows and communicating with the surroundings.

9. A heat sink and air cooler system as claimed in claim 1, wherein said heat sink members are fastened to a heat-generating component with a heat sink latch.

10. A heat sink and air cooler system as claimed in claim 1, wherein said heat-generating components comprise an electronic component, integrated circuit or a central processing unit (CPU).

11. A high-efficiency heat sink and air cooler method for the cooling of heat-generating components, said system comprising:

providing a first heat sink member comprising a center shaft having a plurality of radially outwardly extending fins spaced about the circumference of said shaft, said shaft having one end thereof adapted to be positioned on a heat-generating component; and providing a second heat sink member comprising a cylindrical portion having a plurality of radially inwardly extending fins spaced about the inner circumference of said cylindrical portion, said second heat sink member being mounted in axially overlapping relationship on said first heat sink member whereby said radially outwardly extending fins and radially inwardly extending fins are in an interleaved position relative to each other.

12. A heat sink and air cooler method as claimed in claim 11, wherein said first heat sink member is press-fitted into said second heat sink member such that the radially outer ends of said fins of said first heat sink member contact the inner surface of the cylindrical portion of said second heat sink member, and the radially inner ends of said fins of said second heat sink member contact the circumference of said shaft of said first heat sink member.

13. A heat sink and air cooler method as claimed in claim 11, wherein said first and second heat sink member are each extruded from a thermally-conductive metallic material.

14. A heat sink and air cooler method as claimed in claim 13, wherein said metallic material comprises aluminum or copper.

15. A heat sink and air cooler method as claimed in claim 12, wherein a high-thermally conductive adhesive is applied to the ends of the radial fins of said first and second heat sink members as a lubricant during said press-fitted assembly between said heat sink member.

16. A heat sink and air cooler method as claimed in claim 11, wherein an axial length of the cylindrical portion of said second heat sink member projects beyond said first heat sink member; a turbine or air-moving device comprising fan blades which are selectively rotatable in the same or counter-rotating directions being mounted on said shaft of said first heat sink member within the confines of the axial length of said cylindrical portion so as to facilitate an enhanced air compression above said heat sink system and increasing cooling air flow through the spaces between said interleaved fins.

17. A heat-sink and air cooler method as claimed in claim 16, wherein said turbine or air-moving device comprises at least two said fan blades in superimposed tandem arrangement, said fan blades being directionally selectively rotatable for drawing heated air away from said heat-generating components or directing a flow of cool air towards said heat-generating component.

18. A heat sink and air cooler method as claimed in claim 11, wherein a first end of a bellows connects said heat sink system to an outlet in a wall connected to a second end of said bellows and communicating with the surroundings.

19. A heat sink and air cooler method as claimed in claim 11, wherein said heat sink members are fastened to a heat-generating component with a heat sink latch.

20. A heat sink and air cooler method as claimed in claim 11, wherein said heat-generating components comprise an electronic component, integrated circuit or a central processing unit (CPU).

* * * * *